(12) United States Patent
Zhang et al.

(10) Patent No.: US 11,860,702 B2
(45) Date of Patent: Jan. 2, 2024

(54) CURRENT CONSUMPTION CONTROLLER

(71) Applicant: International Business Machines Corporation, Armonk, NY (US)

(72) Inventors: Xin Zhang, Chappaqua, NY (US); Bruce Fleischer, Bedford Hills, NY (US); Leland Chang, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 245 days.

(21) Appl. No.: 17/122,128

(22) Filed: Dec. 15, 2020

(65) Prior Publication Data
US 2022/0187892 A1    Jun. 16, 2022

(51) Int. Cl.
G06F 1/28      (2006.01)
G01R 19/00    (2006.01)
H02M 3/04    (2006.01)
G06F 1/30      (2006.01)
G06F 1/3296  (2019.01)

(52) U.S. Cl.
CPC ........... *G06F 1/28* (2013.01); *G01R 19/0046* (2013.01); *H02M 3/04* (2013.01)

(58) Field of Classification Search
CPC ......... G06F 1/28; G01R 19/0046; H02M 3/04
See application file for complete search history.

(56) References Cited

U.S. PATENT DOCUMENTS

| | | | |
|---|---|---|---|
| 5,329,491 A | 7/1994 | Brown et al. | |
| 5,572,395 A | 11/1996 | Rasums et al. | |
| 6,518,782 B1 * | 2/2003 | Turner | G01R 21/002 324/756.07 |
| 6,650,092 B1 | 11/2003 | Lidak et al. | |
| 6,853,169 B2 | 2/2005 | Burstein et al. | |
| 7,446,554 B2 | 11/2008 | Kodera | |
| 7,541,793 B2 | 6/2009 | Saeueng et al. | |
| 7,902,803 B2 | 3/2011 | Peng et al. | |
| 8,779,846 B2 | 7/2014 | Allen-Ware et al. | |

(Continued)

FOREIGN PATENT DOCUMENTS

| | | |
|---|---|---|
| CN | 102158077 A | 8/2011 |
| CN | 102263492 A | 11/2011 |
| JP | H10198467 A | 7/1998 |

OTHER PUBLICATIONS

Anonymous. "High-End Multi Mode Voltage Converter." IP.com, IPCOM000010669D. Jan. 8, 2003. 13 pages.

(Continued)

*Primary Examiner* — Phil K Nguyen
*Assistant Examiner* — Gayathri Sampath
(74) *Attorney, Agent, or Firm* — Scully, Scott, Murphy & Presser, P.C.; Daniel P. Morris

(57) ABSTRACT

Methods and systems for controlling current consumption by an electrical load of a first circuit board are described. In an example, a device of a first circuit board can measure a current being drawn by the electrical load of the first circuit board from a second circuit board. The device can generate a control signal based on a current difference between the measured current and a target current. The control signal can represent a load control parameter. The device can apply the control signal to the electrical load of the first circuit board to adjust a current consumption by the electrical load.

23 Claims, 5 Drawing Sheets

(56) References Cited

U.S. PATENT DOCUMENTS

| | | | |
|---|---|---|---|
| 8,924,752 B1 | 12/2014 | Law et al. | |
| 9,612,763 B2 | 4/2017 | Skandakumaran et al. | |
| 10,224,812 B1 | 3/2019 | Sen et al. | |
| 2004/0148060 A1* | 7/2004 | Lee | H02J 3/14 700/295 |
| 2005/0102539 A1* | 5/2005 | Hepner | G06F 1/206 713/300 |
| 2008/0168287 A1* | 7/2008 | Berry | G06F 1/3296 713/323 |
| 2010/0320935 A1* | 12/2010 | Wibben | H05B 45/392 315/294 |
| 2012/0049628 A1* | 3/2012 | Vemulapalli | H02J 7/345 307/43 |
| 2016/0091960 A1* | 3/2016 | Ismail | G06F 1/3206 713/320 |
| 2016/0223596 A1* | 8/2016 | Meng | G01R 15/202 |
| 2017/0102760 A1* | 4/2017 | Duell | G06F 1/26 |
| 2020/0363860 A1 | 11/2020 | Ananthakrishnan et al. | |

OTHER PUBLICATIONS

International Search Report and Written Opinion dated Mar. 2, 2022 issued in PCT/IB2021/060970, 9 pages.

* cited by examiner

CURRENT CONSUMPTION CONTROLLER

BACKGROUND

The present disclosure relates in general to circuits and power management of circuits, for example, circuits, apparatus, systems and methods that can monitor power consumption of extension cards or circuit boards.

An extension card (or extension board, or expansion card) can be used to add various functions to a computing system to enhance the computer system. For example, the extension card can be plugged into a connector on the computer system's motherboard. The motherboard can include a power supply to supply power to the extension card. The extension card can be assigned with a power consumption limit. In some examples, the motherboard can have a specification to limit the plugged-in extension card, such as a current limit through the power supply and ground pins of the extension card connector.

In traditional extension card design and card power management schemes, the power consumption of the extension card can be estimated and this estimation can be used to set the limit specified by the specification of the motherboard. In some examples, software approach can be used to monitored current and power consumption of the extension card, and if the current or power exceeds the limits specified by the specification, the software can throttle the functioning units on the extension card to lower the current and power consumption by the extension card. For example, some power saving, power gating, power reduction, or low power mode schemes, can be managed by an operating system's power management software, or through basic input/output system (BIOS), running on the motherboard. However, such traditional power management schemes can be relatively slow. Further, the traditional management schemes are typically triggered by a detection that power consumption is exceeding a limit (or current exceeding a current limit).

SUMMARY

In some examples, a device for controlling current consumption by an electrical load is generally described. The device can include a current sensing circuit configured to measure a current being drawn by an electrical load of a first circuit board from a second circuit board. The device can further include a controller configured to receive a current difference between the measured current and a target current. The controller can be further configured to generate a control signal based on the current difference. The control signal can represent a load control parameter. The controller can be further configured to apply the control signal to the electrical load of the first circuit board. The application of the control signal can adjust a current consumption by the electrical load.

In some examples, a device for controlling current consumption by an electrical load is generally described. The device can include a current sensing circuit configured to measure a current being drawn by an electrical load of a first circuit board from a second circuit board. The device can further include a controller configured to receive a current difference between the measured current and a target current. The controller can be further configured to generate a control signal based on the current difference. The control signal can represent a load control parameter. The controller can be further configured to apply the control signal to the electrical load of the first circuit board. The application of the control signal can adjust a current consumption by the electrical load. The current sensing circuit and the controller can be components of the first circuit board.

In some examples, a device for controlling current consumption by an electrical load is generally described. The device can include a current sensing circuit configured to measure a current being drawn by an electrical load of a first circuit board from a second circuit board. The device can further include a controller configured to receive a current difference between the measured current and a target current. The controller can be further configured to generate a control signal based on the current difference. The control signal can represent a load control parameter. The controller can be further configured to apply the control signal to the electrical load of the first circuit board. The application of the control signal can adjust a current consumption by the electrical load. The current sensing circuit and the controller can be connected to a power supply monitor of the first circuit board. The current sensing circuit can be configured to send the measured current to the power supply monitor. The controller can be configured to receive the current difference from the power supply monitor.

In some examples, a device for controlling current consumption by an electrical load is generally described. The device can include a current sensing circuit configured to measure a current being drawn by an electrical load of a first circuit board from a second circuit board. The device can further include a controller configured to receive a current difference between the measured current and a target current. The controller can be further configured to generate a control signal based on the current difference. The control signal can represent a load control parameter. The controller can be further configured to apply the control signal to the electrical load of the first circuit board. The application of the control signal can adjust a current consumption by the electrical load. The current sensing circuit can include a current sensing resistor and a sense amplifier. A first terminal and a second terminal of the current sensing resistor can be coupled to the sense amplifier. The sense amplifier can be configured to output the measured current to a power supply monitor of the first circuit board.

In some examples, a device for controlling current consumption by an electrical load is generally described. The device can include a current sensing circuit configured to measure a current being drawn by an electrical load of a first circuit board from a second circuit board. The device can further include a controller configured to receive a current difference between the measured current and a target current. The controller can be further configured to generate a control signal based on the current difference. The control signal can represent a load control parameter. The controller can be further configured to apply the control signal to the electrical load of the first circuit board. The application of the control signal can adjust a current consumption by the electrical load. The controller can include a compensator configured to determine the load control parameter based on the current difference.

In some examples, a device for controlling current consumption by an electrical load is generally described. The device can include a current sensing circuit configured to measure a current being drawn by an electrical load of a first circuit board from a second circuit board. The device can further include a controller configured to receive a current difference between the measured current and a target current. The controller can be further configured to generate a control signal based on the current difference. The control signal can represent a load control parameter. The controller can be further configured to apply the control signal to the electrical load of the first circuit board. The application of the control signal can adjust a current consumption by the electrical load. The controller can include a compensator configured to determine the load control parameter based on the current difference. The compensator of the controller can be an analog compensator.

In some examples, a device for controlling current consumption by an electrical load is generally described. The device can include a current sensing circuit configured to measure a current being drawn by an electrical load of a first circuit board from a second circuit board. The device can further include a controller configured to receive a current difference between the measured current and a target current. The controller can be further configured to generate a control signal based on the current difference. The control signal can represent a load control parameter. The controller can be further configured to apply the control signal to the electrical load of the first circuit board. The application of the control signal can adjust a current consumption by the electrical load. The controller can include a compensator configured to determine the load control parameter based on the current difference. The compensator of the controller can be a digital compensator.

In some examples, a device for controlling current consumption by an electrical load is generally described. The device can include a current sensing circuit configured to measure a current being drawn by an electrical load of a first circuit board from a second circuit board. The device can further include a controller configured to receive a current difference between the measured current and a target current. The controller can be further configured to generate a control signal based on the current difference. The control signal can represent a load control parameter. The controller can be further configured to apply the control signal to the electrical load of the first circuit board. The application of the control signal can adjust a current consumption by the electrical load. The control signal can be a first control signal, and the controller can be configured to combine the first control signal with a default control signal to generate a second control signal. The default control signal can represent a default load control parameter received from another device external to the first circuit board.

In some examples, a device for controlling current consumption by an electrical load is generally described. The device can include a current sensing circuit configured to measure a current being drawn by an electrical load of a first circuit board from a second circuit board. The device can further include a controller configured to receive a current difference between the measured current and a target current. The controller can be further configured to generate a control signal based on the current difference. The control signal can represent a load control parameter. The controller can be further configured to apply the control signal to the electrical load of the first circuit board. The application of the control signal can adjust a current consumption by the electrical load. The adjustment to the current consumption can include an adjustment to an operating frequency of the electrical load of the first circuit board by a factor defined by the load control parameter.

In some examples, a device for controlling current consumption by an electrical load is generally described. The device can include a current sensing circuit configured to measure a current being drawn by an electrical load of a first circuit board from a second circuit board. The device can further include a controller configured to receive a current difference between the measured current and a target current. The controller can be further configured to generate a control signal based on the current difference. The control signal can represent a load control parameter. The controller can be further configured to apply the control signal to the electrical load of the first circuit board. The application of the control signal can adjust a current consumption by the electrical load. The target current can be a predefined value stored in a memory of the first circuit board.

In some examples, a device for controlling current consumption by an electrical load is generally described. The device can include a current sensing circuit configured to measure a current being drawn by an electrical load of a first circuit board from a second circuit board. The device can further include a controller configured to receive a current difference between the measured current and a target current. The controller can be further configured to generate a control signal based on the current difference. The control signal can represent a load control parameter. The controller can be further configured to apply the control signal to the electrical load of the first circuit board. The application of the control signal can adjust a current consumption by the electrical load. The controller can be further configured to receive a new current difference between the target current and a new current. The new current can be an amount of current drawn by the electrical load in response to the adjustment of the current using the control signal. The controller can be further configured to generate a new control signal based on the new current difference. The controller can be further configured to apply the new control signal to the electrical load to re-adjust the current consumption by the electrical load.

In some examples, a device for controlling current consumption by an electrical load is generally described. The device can include a current sensing circuit configured to measure a current being drawn by an electrical load of a first circuit board from a second circuit board. The device can further include a controller configured to receive a current difference between the measured current and a target current. The controller can be further configured to generate a control signal based on the current difference. The control signal can represent a load control parameter. The controller can be further configured to apply the control signal to the electrical load of the first circuit board. The application of the control signal can adjust a current consumption by the electrical load. The electrical load can be a graphics processing unit (GPU).

In some examples, an apparatus for controlling current consumption by an electrical load is generally described. The apparatus can include an electrical load, a voltage regulator connected to the electrical load, a power supply pin configured to receive a current from a circuit board external to the apparatus, a current sensing circuit connected to the power supply pin and the voltage regulator, and a controller connected to the electrical load and the voltage regulator. The current sensing circuit can be configured to measure the current being received by the power supply pin. The controller can be configured to receive a current difference between the measured current and a target current. The controller can be further configured to generate a control signal based on the current difference, the control signal representing a load control parameter. The controller can be further configured to apply the control signal to the electrical load. The application of the control signal can adjust a current consumption by the electrical load.

In some examples, an apparatus for controlling current consumption by an electrical load is generally described. The apparatus can include an electrical load, a voltage regulator connected to the electrical load, a power supply pin configured to receive a current from a circuit board external to the apparatus, a current sensing circuit connected to the power supply pin and the voltage regulator, and a controller connected to the electrical load and the voltage regulator. The current sensing circuit can be configured to measure the current being received by the power supply pin. The controller can be configured to receive a current difference between the measured current and a target current. The controller can be further configured to generate a control signal based on the current difference, the control signal representing a load control parameter. The controller can be further configured to apply the control signal to the electrical load. The application of the control signal can adjust a current consumption by the electrical load. The apparatus can further include a power supply monitor connected to the voltage regulator, the current sensing circuit, and the controller. The power supply monitor can be configured to receive the measured current from the current sensing circuit. The power supply monitor can be further configured to determine the current difference between the measured current and the target current. The power supply monitor can be further configured to send the current difference to the controller.

In some examples, an apparatus for controlling current consumption by an electrical load is generally described. The apparatus can include an electrical load, a voltage regulator connected to the electrical load, a power supply pin configured to receive a current from a circuit board external to the apparatus, a current sensing circuit connected to the power supply pin and the voltage regulator, and a controller connected to the electrical load and the voltage regulator. The current sensing circuit can be configured to measure the current being received by the power supply pin. The controller can be configured to receive a current difference between the measured current and a target current. The controller can be further configured to generate a control signal based on the current difference, the control signal representing a load control parameter. The controller can be further configured to apply the control signal to the electrical load. The application of the control signal can adjust a current consumption by the electrical load. The current sensing circuit can include a current sensing resistor and a sense amplifier. A first terminal and a second terminal of the current sensing resistor can be coupled to the sense amplifier. The sense amplifier can be configured to output the measured current to a power supply monitor of the apparatus.

In some examples, an apparatus for controlling current consumption by an electrical load is generally described. The apparatus can include an electrical load, a voltage regulator connected to the electrical load, a power supply pin configured to receive a current from a circuit board external to the apparatus, a current sensing circuit connected to the power supply pin and the voltage regulator, and a controller connected to the electrical load and the voltage regulator. The current sensing circuit can be configured to measure the current being received by the power supply pin. The controller can be configured to receive a current difference between the measured current and a target current. The controller can be further configured to generate a control signal based on the current difference, the control signal representing a load control parameter. The controller can be further configured to apply the control signal to the electrical load. The application of the control signal can adjust a current consumption by the electrical load. The controller can include a compensator configured to determine the load control parameter based on the current difference.

In some examples, an apparatus for controlling current consumption by an electrical load is generally described. The apparatus can include an electrical load, a voltage regulator connected to the electrical load, a power supply pin configured to receive a current from a circuit board external to the apparatus, a current sensing circuit connected to the power supply pin and the voltage regulator, and a controller connected to the electrical load and the voltage regulator. The current sensing circuit can be configured to measure the current being received by the power supply pin. The controller can be configured to receive a current difference between the measured current and a target current. The controller can be further configured to generate a control signal based on the current difference, the control signal representing a load control parameter. The controller can be further configured to apply the control signal to the electrical load. The application of the control signal can adjust a current consumption by the electrical load. The control signal can be a first control signal, and the controller can be configured to combine the first control signal with a default control signal to generate a second control signal. The default control signal can represent a default load control parameter received from a device external to the apparatus.

In some examples, an apparatus for controlling current consumption by an electrical load is generally described. The apparatus can include an electrical load, a voltage regulator connected to the electrical load, a power supply pin configured to receive a current from a circuit board external to the apparatus, a current sensing circuit connected to the power supply pin and the voltage regulator, and a controller connected to the electrical load and the voltage regulator. The current sensing circuit can be configured to measure the current being received by the power supply pin. The controller can be configured to receive a current difference between the measured current and a target current. The controller can be further configured to generate a control signal based on the current difference, the control signal representing a load control parameter. The controller can be further configured to apply the control signal to the electrical load. The application of the control signal can adjust a current consumption by the electrical load. The adjustment to the current consumption can include an adjustment to an operating frequency of the electrical load of the apparatus by a factor defined by the load control parameter.

In some examples, an apparatus for controlling current consumption by an electrical load is generally described. The apparatus can include an electrical load, a voltage regulator connected to the electrical load, a power supply pin configured to receive a current from a circuit board external to the apparatus, a current sensing circuit connected to the power supply pin and the voltage regulator, and a controller connected to the electrical load and the voltage regulator. The current sensing circuit can be configured to measure the current being received by the power supply pin. The controller can be configured to receive a current difference between the measured current and a target current. The controller can be further configured to generate a control signal based on the current difference, the control signal representing a load control parameter. The controller can be further configured to apply the control signal to the electrical load. The application of the control signal can adjust a current consumption by the electrical load. The target current can be a predefined value stored in a memory of the apparatus.

In some examples, an apparatus for controlling current consumption by an electrical load is generally described. The apparatus can include an electrical load, a voltage regulator connected to the electrical load, a power supply pin configured to receive a current from a circuit board external to the apparatus, a current sensing circuit connected to the power supply pin and the voltage regulator, and a controller connected to the electrical load and the voltage regulator. The current sensing circuit can be configured to measure the current being received by the power supply pin. The controller can be configured to receive a current difference between the measured current and a target current. The controller can be further configured to generate a control signal based on the current difference, the control signal representing a load control parameter. The controller can be further configured to apply the control signal to the electrical load. The application of the control signal can adjust a current consumption by the electrical load. The electrical load can be a graphics processing unit (GPU).

In some examples, a method for controlling current consumption by an electrical load is generally described. The method can include measuring, by a device on a first circuit board, a current being drawn by an electrical load of the first circuit board from a second circuit board. The method can further include generating, by the device, a control signal based on a current difference between the measured current and a target current, the control signal representing a load control parameter. The method can further include applying, by the device, the control signal to the electrical load of the first circuit board. The application of the control signal can adjust a current consumption by the electrical load.

In some examples, a method for controlling current consumption by an electrical load is generally described. The method can include measuring, by a device on a first circuit board, a current being drawn by an electrical load of the first circuit board from a second circuit board. The method can further include generating, by the device, a control signal based on a current difference between the measured current and a target current, the control signal representing a load control parameter. The method can further include applying, by the device, the control signal to the electrical load of the first circuit board. The application of the control signal can adjust a current consumption by the electrical load. The method can further include combining, by the device, the load control parameter with a default load control parameter to generate the control signal.

In some examples, a method for controlling current consumption by an electrical load is generally described. The method can include measuring, by a device on a first circuit board, a current being drawn by an electrical load of the first circuit board from a second circuit board. The method can further include generating, by the device, a control signal based on a current difference between the measured current and a target current, the control signal representing a load control parameter. The method can further include applying, by the device, the control signal to the electrical load of the first circuit board. The application of the control signal can adjust a current consumption by the electrical load. The method can further include measuring, by the device, a new current being drawn by the electrical load. The method can further include generating, by the device, a new control signal based on a new current difference between the new measured current and the target current. The method can further include applying, by the device, the new control signal to the electrical load of the first circuit board to re-adjust the current consumption by the electrical load.

In some examples, a method for controlling current consumption by an electrical load is generally described. The method can include measuring, by a device on a first circuit board, a current being drawn by an electrical load of the first circuit board from a second circuit board. The method can further include generating, by the device, a control signal based on a current difference between the measured current and a target current, the control signal representing a load control parameter. The method can further include applying, by the device, the control signal to the electrical load of the first circuit board. The application of the control signal can adjust a current consumption by the electrical load. The electrical load can be a graphics processing unit (GPU).

Further features as well as the structure and operation of various embodiments are described in detail below with reference to the accompanying drawings. In the drawings, like reference numbers indicate identical or functionally similar elements.

DETAILED DESCRIPTION

Figure 1:
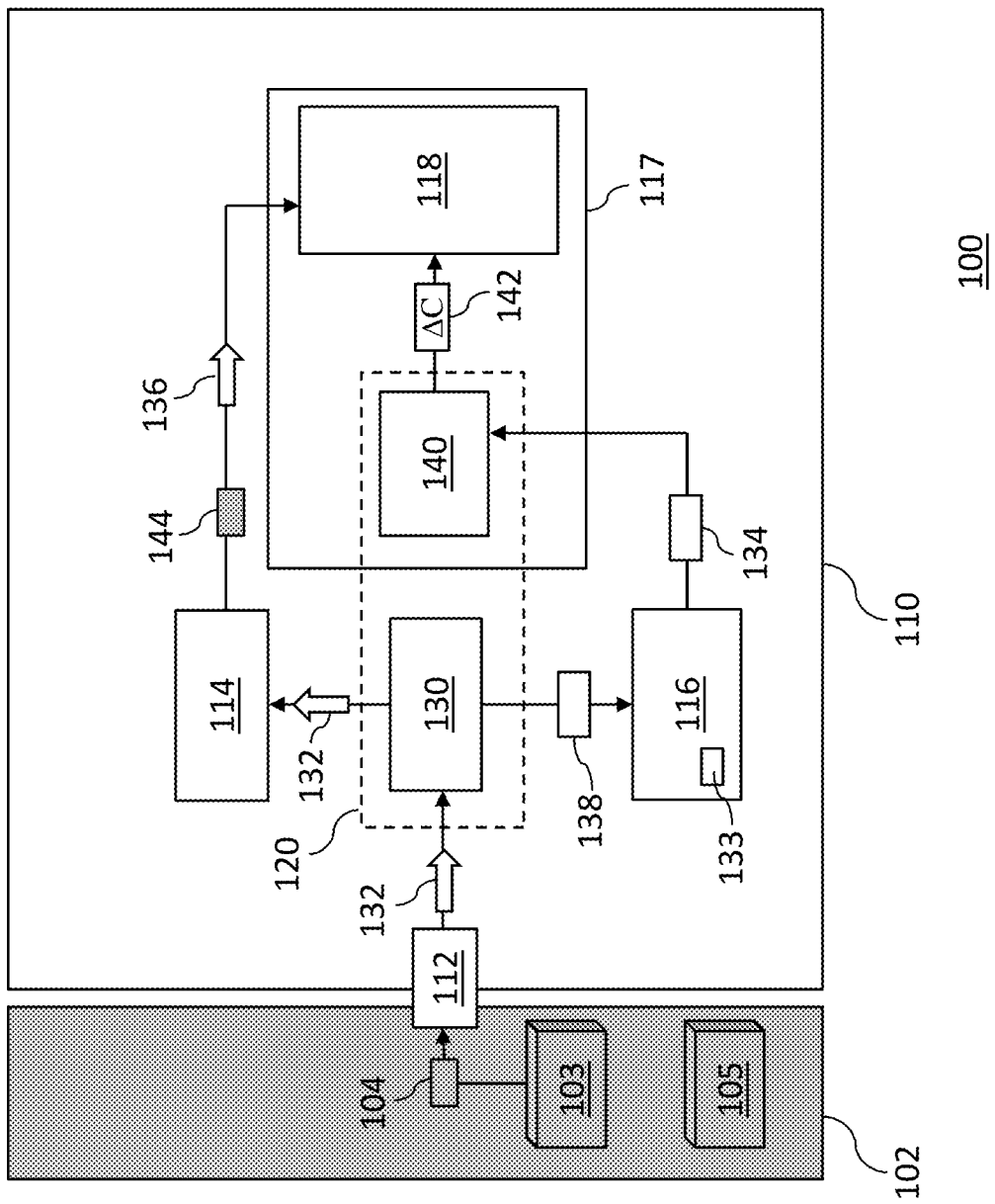
FIG. 1 is a diagram showing an example system that can implement extension card current monitor in one embodiment.

The methods and systems described herein can provide a device or structure, integrated in or embedded on, an extension card to implement closed loop control, discrete or continuous time control, and/or local control power consumption of one or more loads on the extension card. The device described in accordance with the present disclosure can monitor current flowing through a voltage supply pin on the extension card, which can be a daughter card connected to a main card. Further, since the device is integrated in, or embedded on, the daughter card, the monitoring and control can be performed by the daughter card locally without a host device (e.g., the motherboard) involved. Further, the methods and systems described herein can enable a functional unit or processor of the extension card to perform at maximum current and power within the extension card's voltage or power supply pin specification, instead of using an estimated limit within the motherboard's specification. By way of example, a functional unit of an extension card can be, but not limited to, a processor such as a graphics processing unit (GPU), a field programmable gate array (FPGA), a system on a chip (SoC), or another special purpose processor. Some functional units can be referred to as accelerators. By being able to perform at maximum current and power within the motherboard's specification, the functional unit on the extension card can use maximum power to achieve maximum performance. Furthermore, the closed loop control, discrete or continuous time control, and local control being implemented by the extension card can provide a relatively faster power management control when compared to control schemes being performed by devices outside of the extension card.

In an example embodiment, a device for controlling current consumption by an electrical load described herein can measure a current being drawn by an electrical load of the first circuit board from a second circuit board, receive a current difference between the measured current and a target current, and generate a control signal based on the current difference. The control signal can define a load control parameter that can be applied to the electrical load of the first circuit board to adjust a current consumption by the electrical load. The measurement the current being drawn by the electrical load, and the adjustment of current being consumed by the electrical load, can allow the device to perform local power consumption monitoring and control on the first circuit board.

In another example embodiment, a device for controlling current consumption by an electrical load described in accordance with the present disclosure can include a current sensing circuit and a controller. The device can be embedded or integrated in a first circuit board. The current sensing circuit can measure a current being drawn by an electrical load of the first circuit board from a second circuit board. The controller can receive a current difference between the measured current and a target current, and generate a control signal based on the current difference. The control signal can define a load control parameter that can be applied to the electrical load of the first circuit board to adjust a current consumption by the electrical load. The current sensing circuit and the controller can be components of the first circuit board. The integration of the device in the first circuit board can allow the first circuit board to monitor and control power or current consumption by the electrical load without involving a host device (e.g., the second circuit board).

In another example embodiment, a device for controlling current consumption by an electrical load described in accordance with the present disclosure can include a current sensing circuit and a controller. The device can be embedded or integrated in a first circuit board. The current sensing circuit can measure a current being drawn by an electrical load of the first circuit board from a second circuit board. The controller can receive a current difference between the measured current and a target current, and generate a control signal based on the current difference. The control signal can define a load control parameter that can be applied to the electrical load of the first circuit board to adjust a current consumption by the electrical load. The current sensing circuit and the controller can be connected to a power supply monitor of the first circuit board. The current sensing circuit can be configured to send the measured current to the power supply monitor. The controller can be configured to receive the current difference from the power supply monitor. The utilization of the power supply monitor of the first circuit board can allow the device to perform current monitoring and control without adding additional components that may occupy board space.

In another example embodiment, a device for controlling current consumption by an electrical load described in accordance with the present disclosure can include a current sensing circuit and a controller. The device can be embedded or integrated in a first circuit board. The current sensing circuit can measure a current being drawn by an electrical load of the first circuit board from a second circuit board. The controller can receive a current difference between the measured current and a target current, and generate a control signal based on the current difference. The control signal can define a load control parameter that can be applied to the electrical load of the first circuit board to adjust a current consumption by the electrical load. The current sensing circuit can include a current sensing resistor and a sense amplifier. A first terminal and a second terminal of the current sensing resistor can be coupled to the sense amplifier. The sense amplifier can be configured to output the measured current to a power supply monitor of the first circuit board. The current sensing resistor and the sense amplifier can be components that may be readily obtainable to construct the device that can be embedded or integrated in the first circuit board.

In another example embodiment, a device for controlling current consumption by an electrical load described in accordance with the present disclosure can include a current sensing circuit and a controller. The device can be embedded or integrated in a first circuit board. The current sensing circuit can measure a current being drawn by an electrical load of the first circuit board from a second circuit board. The controller can receive a current difference between the measured current and a target current, and generate a control signal based on the current difference. The control signal can define a load control parameter that can be applied to the electrical load of the first circuit board to adjust a current consumption by the electrical load. The controller can include a compensator configured to determine the load control parameter based on the current difference. The compensator can be an analog compensator or a digital compensator. The analog or digital compensator can be a component that may be readily available to construct the device that can be embedded or integrated in the first circuit board.

In another example embodiment, a device for controlling current consumption by an electrical load described in accordance with the present disclosure can include a current sensing circuit and a controller. The device can be embedded or integrated in a first circuit board. The current sensing circuit can measure a current being drawn by an electrical load of the first circuit board from a second circuit board. The controller can receive a current difference between the measured current and a target current, and generate a control signal based on the current difference. The control signal can define a load control parameter that can be applied to the electrical load of the first circuit board to adjust a current consumption by the electrical load. Alternatively, the control signal can be a first control signal, and the controller can be configured to combine the first control signal with a default control signal to generate a second control signal. The default control signal can represent a default load control parameter received from another device external to the first circuit board. The utilization of the default load control parameter can provide a relatively finer control of the current consumption by the electrical load.

In another example embodiment, a device for controlling current consumption by an electrical load described in accordance with the present disclosure can include a current sensing circuit and a controller. The device can be embedded or integrated in a first circuit board. The current sensing circuit can measure a current being drawn by an electrical load of the first circuit board from a second circuit board. The controller can receive a current difference between the measured current and a target current, and generate a control signal based on the current difference. The control signal can define a load control parameter that can be applied to the electrical load of the first circuit board to adjust a current consumption by the electrical load. The adjustment to the current consumption can include an adjustment to an operating frequency of the electrical load of the first circuit board by a factor defined by the load control parameter. The adjustment to the operating frequency can allow the current consumption and the power consumption by the electrical load to be adjusted without changing the voltage being applied on the electrical load.

In another example embodiment, a device for controlling current consumption by an electrical load described in accordance with the present disclosure can include a current sensing circuit and a controller. The device can be embedded or integrated in a first circuit board. The current sensing circuit can measure a current being drawn by an electrical load of the first circuit board from a second circuit board. The controller can receive a current difference between the measured current and a target current, and generate a control signal based on the current difference. The control signal can define a load control parameter that can be applied to the electrical load of the first circuit board to adjust a current consumption by the electrical load. The target current can be a predefined value stored in a memory of the first circuit board. The storage of the target current in the memory of the first circuit board can provide local current consumption control.

In another example embodiment, a device for controlling current consumption by an electrical load described in accordance with the present disclosure can include a current sensing circuit and a controller. The device can be embedded or integrated in a first circuit board. The current sensing circuit can measure a current being drawn by an electrical load of the first circuit board from a second circuit board. The controller can receive a current difference between the measured current and a target current, and generate a control signal based on the current difference. The control signal can define a load control parameter that can be applied to the electrical load of the first circuit board to adjust a current consumption by the electrical load. The controller can be further configured to receive a new current difference between the target current and a new current. The new current can be an amount of current drawn by the electrical load in response to the adjustment of the current using the control signal. The controller can be further configured to generate a new control signal based on the new current difference. The controller can be further configured to apply the new control signal to the electrical load to re-adjust the current consumption by the electrical load. The continued measurement of current being drawn and adjustment of current being consumed by the electrical load can provide a closed-loop control of power consumption by the electrical load.

In another example embodiment, a device for controlling current consumption by an electrical load described in accordance with the present disclosure can include a current sensing circuit and a controller. The device can be embedded or integrated in a first circuit board. The current sensing circuit can measure a current being drawn by an electrical load of the first circuit board from a second circuit board. The controller can receive a current difference between the measured current and a target current, and generate a control signal based on the current difference. The control signal can define a load control parameter that can be applied to the electrical load of the first circuit board to adjust a current consumption by the electrical load. The electrical load can be a graphics processing unit (GPU). The measurement the current being drawn by the GPU, and the adjustment of current being consumed by the GPU, can allow the GPU to perform at a controlled level of power without limits set by a host device (e.g., the second circuit board).

In an example embodiment, an apparatus for controlling current consumption by an electrical load described herein can include an electrical load, a voltage regulator connected to the electrical load, a power supply pin configured to receive a current from a circuit board external to the apparatus, a current sensing circuit connected to the power supply pin and the voltage regulator, and a controller connected to the electrical load and the voltage regulator. The current sensing circuit can be configured to measure the current being received by the power supply pin. The controller can be configured to receive a current difference between the measured current and a target current. The controller can be further configured to generate a control signal based on the current difference, the control signal representing a load control parameter. The controller can be further configured to apply the control signal to the electrical load. The application of the control signal can adjust a current consumption by the electrical load. The measurement the current being drawn by the electrical load, and the adjustment of current being consumed by the electrical load, can allow the apparatus to perform local power consumption monitoring and control.

In another example embodiment, an apparatus for controlling current consumption by an electrical load described herein can include an electrical load, a voltage regulator connected to the electrical load, a power supply pin configured to receive a current from a circuit board external to the apparatus, a current sensing circuit connected to the power supply pin and the voltage regulator, and a controller connected to the electrical load and the voltage regulator. The current sensing circuit can be configured to measure the current being received by the power supply pin. The controller can be configured to receive a current difference between the measured current and a target current. The controller can be further configured to generate a control signal based on the current difference, the control signal representing a load control parameter. The controller can be further configured to apply the control signal to the electrical load. The application of the control signal can adjust a current consumption by the electrical load. The apparatus can further include a power supply monitor connected to the voltage regulator, the current sensing circuit, and the controller. The power supply monitor can be configured to receive the measured current from the current sensing circuit. The power supply monitor can be further configured to determine the current difference between the measured current and the target current. The power supply monitor can be further configured to send the current difference to the controller. The utilization of the power supply monitor of the apparatus can allow the apparatus to perform power consumption monitoring and control on the electrical load using local components.

In another example embodiment, an apparatus for controlling current consumption by an electrical load described herein can include an electrical load, a voltage regulator connected to the electrical load, a power supply pin configured to receive a current from a circuit board external to the apparatus, a current sensing circuit connected to the power supply pin and the voltage regulator, and a controller connected to the electrical load and the voltage regulator. The current sensing circuit can be configured to measure the current being received by the power supply pin. The controller can be configured to receive a current difference between the measured current and a target current. The controller can be further configured to generate a control signal based on the current difference, the control signal representing a load control parameter. The controller can be further configured to apply the control signal to the electrical load. The application of the control signal can adjust a current consumption by the electrical load. The current sensing circuit can include a current sensing resistor and a sense amplifier. A first terminal and a second terminal of the current sensing resistor can be coupled to the sense amplifier. The sense amplifier can be configured to output the measured current to a power supply monitor of the apparatus. The current sensing resistor and the sense amplifier can be components that may be readily obtainable to construct the device that can be embedded or integrated in the apparatus.

In another example embodiment, an apparatus for controlling current consumption by an electrical load described herein can include an electrical load, a voltage regulator connected to the electrical load, a power supply pin configured to receive a current from a circuit board external to the apparatus, a current sensing circuit connected to the power supply pin and the voltage regulator, and a controller connected to the electrical load and the voltage regulator. The current sensing circuit can be configured to measure the current being received by the power supply pin. The controller can be configured to receive a current difference between the measured current and a target current. The controller can be further configured to generate a control signal based on the current difference, the control signal representing a load control parameter. The controller can be further configured to apply the control signal to the electrical load. The application of the control signal can adjust a current consumption by the electrical load. The controller can include a compensator configured to determine the load control parameter based on the current difference. The compensator can be a component that may be readily available to construct the device that can be embedded or integrated in the first circuit board.

In another example embodiment, an apparatus for controlling current consumption by an electrical load described herein can include an electrical load, a voltage regulator connected to the electrical load, a power supply pin configured to receive a current from a circuit board external to the apparatus, a current sensing circuit connected to the power supply pin and the voltage regulator, and a controller connected to the electrical load and the voltage regulator. The current sensing circuit can be configured to measure the current being received by the power supply pin. The controller can be configured to receive a current difference between the measured current and a target current. The controller can be further configured to generate a control signal based on the current difference, the control signal representing a load control parameter. The controller can be further configured to apply the control signal to the electrical load. The application of the control signal can adjust a current consumption by the electrical load. The control signal can be a first control signal, and the controller can be configured to combine the first control signal with a default control signal to generate a second control signal. The default control signal can represent a default load control parameter received from a device external to the apparatus. The utilization of the default load control parameter can provide a relatively finer control of the current consumption by the electrical load.

In another example embodiment, an apparatus for controlling current consumption by an electrical load described herein can include an electrical load, a voltage regulator connected to the electrical load, a power supply pin configured to receive a current from a circuit board external to the apparatus, a current sensing circuit connected to the power supply pin and the voltage regulator, and a controller connected to the electrical load and the voltage regulator. The current sensing circuit can be configured to measure the current being received by the power supply pin. The controller can be configured to receive a current difference between the measured current and a target current. The controller can be further configured to generate a control signal based on the current difference, the control signal representing a load control parameter. The controller can be further configured to apply the control signal to the electrical load. The application of the control signal can adjust a current consumption by the electrical load. The adjustment to the current consumption can include an adjustment to an operating frequency of the electrical load of the apparatus by a factor defined by the load control parameter. The adjustment to the operating frequency can allow the current consumption and the power consumption by the electrical load to be adjusted without changing the voltage being applied on the electrical load.

In another example embodiment, an apparatus for controlling current consumption by an electrical load described herein can include an electrical load, a voltage regulator connected to the electrical load, a power supply pin configured to receive a current from a circuit board external to the apparatus, a current sensing circuit connected to the power supply pin and the voltage regulator, and a controller connected to the electrical load and the voltage regulator. The current sensing circuit can be configured to measure the current being received by the power supply pin. The controller can be configured to receive a current difference between the measured current and a target current. The controller can be further configured to generate a control signal based on the current difference, the control signal representing a load control parameter. The controller can be further configured to apply the control signal to the electrical load. The application of the control signal can adjust a current consumption by the electrical load. The target current can be a predefined value stored in a memory of the apparatus. The storage of the target current in the memory of the apparatus can provide local current consumption control.

In another example embodiment, an apparatus for controlling current consumption by an electrical load described herein can include an electrical load, a voltage regulator connected to the electrical load, a power supply pin configured to receive a current from a circuit board external to the apparatus, a current sensing circuit connected to the power supply pin and the voltage regulator, and a controller connected to the electrical load and the voltage regulator. The current sensing circuit can be configured to measure the current being received by the power supply pin. The controller can be configured to receive a current difference between the measured current and a target current. The controller can be further configured to generate a control signal based on the current difference, the control signal representing a load control parameter. The controller can be further configured to apply the control signal to the electrical load. The application of the control signal can adjust a current consumption by the electrical load. The electrical load can be a graphics processing unit (GPU). The measurement the current being drawn by the GPU, and the adjustment of current being consumed by the GPU, can allow the GPU to perform at a controlled level of power without limits set by a host device (e.g., the second circuit board).

In an example embodiment, a method for controlling current consumption by an electrical load described herein can include measuring, by a device on a first circuit board, a current being drawn by an electrical load of the first circuit board from a second circuit board. The method can further include generating, by the device, a control signal based on a current difference between the measured current and a target current, the control signal representing a load control parameter. The method can further include applying, by the device, the control signal to the electrical load of the first circuit board. The application of the control signal can adjust a current consumption by the electrical load. The measurement the current being drawn by the electrical load, and the adjustment of current being consumed by the electrical load, can allow the device to perform local power consumption monitoring and control on the first circuit board.

In another example embodiment, a method for controlling current consumption by an electrical load described herein can include measuring, by a device on a first circuit board, a current being drawn by an electrical load of the first circuit board from a second circuit board. The method can further include generating, by the device, a control signal based on a current difference between the measured current and a target current, the control signal representing a load control parameter. The method can further include applying, by the device, the control signal to the electrical load of the first circuit board. The application of the control signal can adjust a current consumption by the electrical load. The method can further include combining, by the device, the load control parameter with a default load control parameter to generate the control signal. The utilization of the default load control parameter can provide a relatively finer control of the current consumption by the electrical load.

In another example embodiment, a method for controlling current consumption by an electrical load described herein can include measuring, by a device on a first circuit board, a current being drawn by an electrical load of the first circuit board from a second circuit board. The method can further include generating, by the device, a control signal based on a current difference between the measured current and a target current, the control signal representing a load control parameter. The method can further include applying, by the device, the control signal to the electrical load of the first circuit board. The application of the control signal can adjust a current consumption by the electrical load. The method can further include measuring, by the device, a new current being drawn by the electrical load. The method can further include generating, by the device, a new control signal based on a new current difference between the new measured current and the target current. The method can further include applying, by the device, the new control signal to the electrical load of the first circuit board to re-adjust the current consumption by the electrical load. The continued measurement of current being drawn and adjustment of current being consumed by the electrical load can provide a closed-loop control of power consumption by the electrical load.

In another example embodiment, a method for controlling current consumption by an electrical load described herein can include measuring, by a device on a first circuit board, a current being drawn by an electrical load of the first circuit board from a second circuit board. The method can further include generating, by the device, a control signal based on a current difference between the measured current and a target current, the control signal representing a load control parameter. The method can further include applying, by the device, the control signal to the electrical load of the first circuit board. The application of the control signal can adjust a current consumption by the electrical load. The electrical load can be a graphics processing unit (GPU). The measurement the current being drawn by the GPU, and the adjustment of current being consumed by the GPU, can allow the GPU to perform at a controlled level of power without limits set by a host device (e.g., the second circuit board).

FIG. 1 is a diagram showing an example system 100 that can implement extension card current monitor in one embodiment. The system 100 can include a circuit board 102 and a circuit board 110. The first circuit board 102 can be a circuit board including a power supply configured to provide power to the circuit board 110. In an example embodiment, the circuit board 102 can be a main card (e.g., a motherboard) and the circuit board 110 can be a daughter card (e.g., expansion card or extension card) mounted or embedded on the circuit board 102. The circuit board 102 can include a power supply 103 and a processor 105, where the processor 105 can be a main processor or a central processing unit (CPU) of the circuit board 102. The circuit board 110 can include a power supply pins or power connectors 112, a voltage regulator 114, a power supply monitor 116, a functional circuit or block 117, and a device 120. The circuit board 110 can be connected or coupled to the circuit board 102 via one or more pins including the power supply pin 112. The connection of the circuit board 110 to the circuit board 102 via the power supply pin 112 can form a closed circuit. The closed circuit formed by the connection at the power supply pin 112 can allow current to flow between the circuit board 102 and the circuit board 110, and can allow the circuit board 102 to supply an input voltage 104 to the circuit board 110.

The functional unit 117 can include one or more electrical loads, such as an electrical load 118, that can consume power when in operation mode. The electrical load 118 can be, for example, a circuit programmed or designed to perform specific tasks or functions, such as arithmetic functions. For example, the electrical load 118 can be, but not limited to, an accelerator such as a GPU, a FPGA, a SoC, or a special purpose processor, for example, programmed to enhance and/or supplement operations of the circuit board 102 upon connecting the circuit board 110 to the circuit board 102. In an example, upon connecting the circuit board 110 to the circuit board 102 via the power supply pin 112, the functional unit 117 can operate the electrical load 118 by consuming power being supplied by the circuit board 102. The circuit board 102 can supply power to the circuit board 110 by applying a voltage 104 to the circuit board 110 via the power supply pin 112. The power consumption by the electrical load 118 can draw an amount of current 132 from the circuit board 102, where the current can flow from the circuit board 102 to the circuit board 110 through the power supply pin 112.

The device 120 can be embedded on, or integrated into, the circuit board 110 to provide a closed loop control of current being drawn by the electrical load 118 of the functional unit 117. For example, the device 120 can monitor the current 132 being drawn by the electrical load 118 and other loads that are not shown in the figure, and determine or calculate a parameter that can be used to adjust current flowing into the electrical load 118. The device 120 can be configured to monitor the current 132 in a discrete or continuous time manner depending on a desired implementation of the system 100. The device 120 can include a current sensing circuit 130 and a controller 140. In an example embodiment, the device 120 can be embedded on the circuit board 110 such that the controller 140 is connected to the electrical load 118 of the functional unit 117.

The current sensing circuit 130 can be connected between the power supply pin 112, the voltage regulator 114, and the power supply monitor 116. The current sensing circuit 130 can be configured to measure the current 132, where the current 132 can flow through the current sensing circuit 130. The current sensing circuit 130 can send a value of the measurement, labeled as current measurement 138 in FIG. 1, to the power supply monitor 116. The current 132 can also flow to the voltage regulator 114. The voltage regulator 114 can be configured to receive the voltage 104 according to specifications of the electrical load 118. For example, the voltage regulator 114 can receive the voltage 104 and generate another voltage 144, and the voltage 144 can be applied to the electrical load 118 of the functional unit 117. The regulated voltage 144 can have a voltage value different from the voltage 104, and the regulated voltage 144 can be a voltage required to operate the electrical load 118. As a result of regulating the voltage 104 into voltage 144, the current 132 that entered the voltage regulator 114 can be outputted as a current 136 that can be different from the current 132. The difference between the current 132 and the current 136 can be based on a voltage conversion ratio applied by the voltage regulator to adjust the voltage 104 into the voltage 144.

The power supply monitor 116 can receive the current 132 and compare the current 132 with a target current 133. In an example, the target current 133 can be a predefined value (e.g., an amount of current) provided by the circuit board 102 or another device external to the circuit board 110, and can be stored in a memory (e.g., volatile or non-volatile memory) of the circuit board 110. In an example embodiment, the target current 133 can be derived from a specification, such as by dividing a target power specification by the voltage 104. The power supply monitor 116 can determine a difference, labeled as current difference 134 in FIG. 1, between the current 132 and the target current 133. The power supply monitor 116 can send the current difference 134 to the controller 140 of the device 120.

The controller 140 can receive the current difference 134, and calculate or determine a load control parameter $\Delta C$ based on the current difference 134. The controller 140 can generate a control signal 142 representing $\Delta C$, and can adjust the current 136 flowing into the electrical load 118 using the control signal 142. For example, the control signal 142 can adjust an operating frequency of the electrical load 118, or modulate the amount of workload being processed by electrical load 118, by a factor that can be based on $\Delta C$. The factor can be $\Delta C$, or can be a combination of $\Delta C$ with one or more additional parameters (described below). The adjustment to the operating frequency of the electrical load 118 can adjust the current 136. In an example, the current difference 134 can indicate whether the current 132 is greater than, less than, or equivalent to, the target current 133. The current 132 being greater than the target current 133 can indicate that the electrical load 118 may be drawing excessive current. The current 132 being less than the target current 133 can indicate that the electrical load 118 may be drawing insufficient current. In an example, in response to the current 132 being greater than the target current 133, the controller 140 can set $\Delta C$ to a value that can decrease the operating frequency of the electrical load 118 by the factor $\Delta C$ in order to decrease the current 136. In another example, in response to the current 132 being less than the target current 133, the controller 140 can set $\Delta C$ to a value that can increase the operating frequency of the electrical load 118 by the factor $\Delta C$ in order to increase the current 136.

As a result of using the control signal 142 to adjust the current 136 by the factor of $\Delta C$, the electrical load 118 can consume the adjusted current instead of the current 136. The device 120 can perform the current monitoring and adjustment without changing the regulated voltage 144 being supplied to the electrical load 118. Thus, the current adjustment being performed by the device 120 can adjust the power consumption by the electrical load 118 without changing the regulated voltage 144. The monitoring and current adjustment by the device 120 can provide a closed-loop control of the current 132 being drawn by the electrical load 118. Further, the closed-loop control can be implemented by a daughter card, such as the circuit board 110, without involving another device or a host (e.g., a processor 105 of the circuit board 102).

Figure 2:
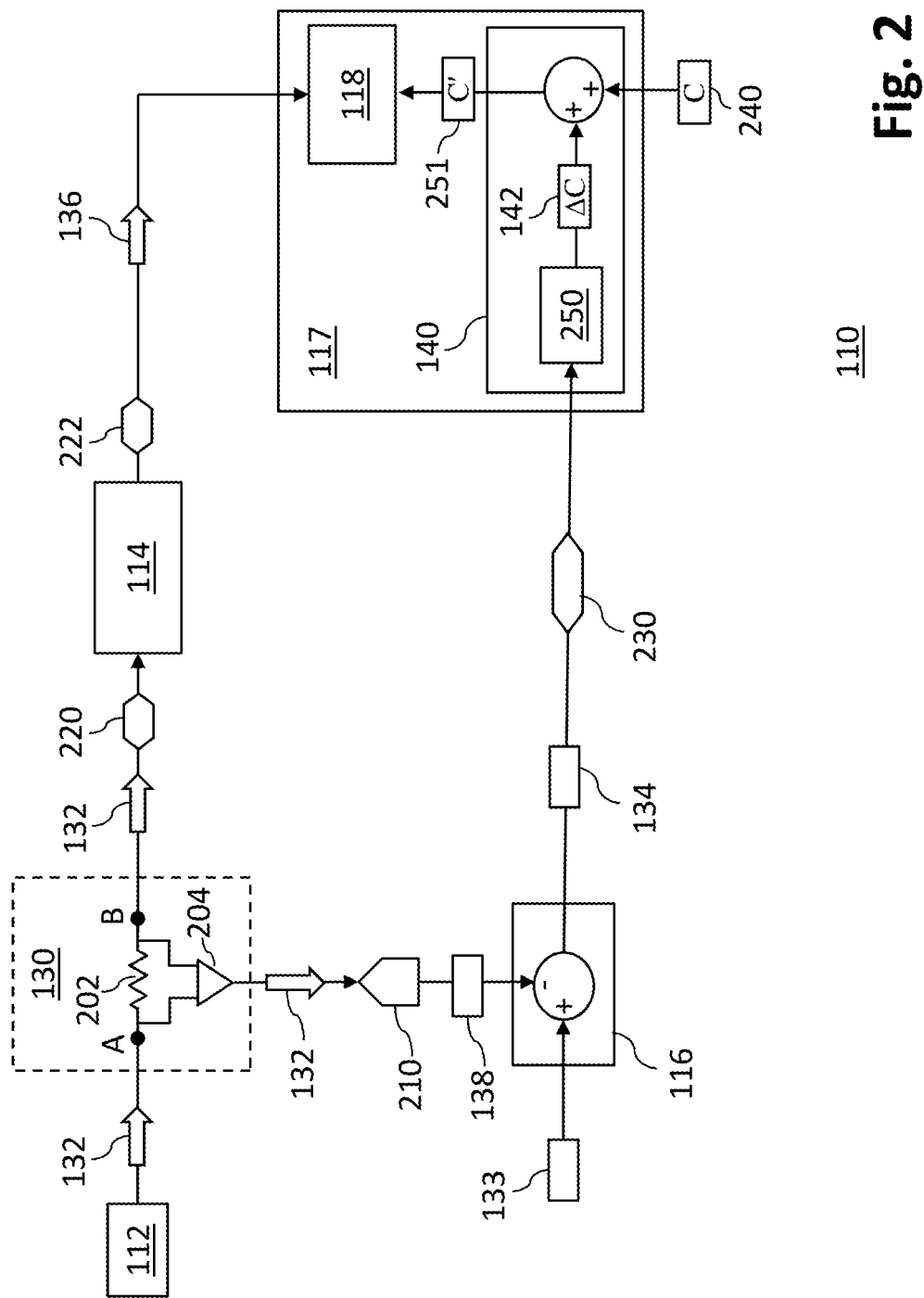
FIG. 2 is a diagram showing details of a circuit board among the example system of FIG. 1 in one embodiment.

FIG. 2 is a diagram showing details of the circuit board 110 in one embodiment, for example, shown in FIG. 1. In an example shown in FIG. 2, the current sensing circuit 130 can include a current sensing resistor 202 and a sense amplifier 204. The current sensing resistor 202 can include two terminals labeled as A and B in FIG. 2. The terminal A can be connected to the power supply pin 112, and the terminal B can be connected to the voltage regulator 114. In some examples, a decoupling filter 220 can be situated between the terminal B of the current sensing resistor 202 and the voltage regulator 114. The decoupling filter 220 can be configured to stabilize voltage and to filter supply noises. The sense amplifier 204 can include two input terminals, and these two input terminals can be connected to the terminals A and B of the current sensing resistor 202. The sense amplifier 204 can detect the current 132 flowing through the current sensing resistor 202, such as from terminal A to terminal B, and can output the current 132 to an analog-to-digital converter (ADC) 210. The ADC 210 can be connected between the sense amplifier 204 and the power supply monitor 116. The ADC 210 can be configured to convert the current 132 into the current measurement 138 and send the current measurement 138 to the power supply monitor 116. The power supply monitor 116 can determine or calculate the current difference 134 between the current 132 and the target current 133. The power supply monitor 116 can send the current difference 134 to the controller 140. In some examples, the current difference 134 can be transmitted to the controller 140 via a communication bus, where the transmission via the communication bus can consume a bus communication delay 230.

In an example, the controller 140 can include a compensator 250, where the compensator 250 can be an analog compensator or a digital compensator. The current difference 134 can be transmitted from the power supply monitor 116 to the compensator 250 of the controller 140. Based on the current difference 134, the compensator 250 can determine the load control parameter $\Delta C$ and generate the control signal 142 that represents $\Delta C$. In some examples, the control signal 142 can be combined with another signal 240 representing another parameter, such as a default load control parameter denoted as C in FIG. 2. In an example, the default load control parameter C can be a predefined value provided by another device external to the circuit board 110 as the signal 240. In an example, the default load control parameter C can be an operating frequency of the electrical load 118 determined or calculated by an algorithm that estimates an appropriate amount of current to be drawn by the electrical load 118 under different operating environments. The controller 140 can receive the signal 240 and combine $\Delta C$ with C to determine a parameter C', and the controller 140 can generate another control signal 251 that represents C'. In another example embodiment, the controller 140 can receive the default load control parameter C and combine C with $\Delta C$ to generate C', then generate the signal 251 using the value of C'. The controller 140 can adjust the operating frequency of the electrical load 118 by a factor of C' (e.g., by applying the control signal 251 to electrical load 118) in order to adjust the current 136. In another example embodiment, if the signal 240 is not being provided to the controller 140 (e.g., C=0), the control signal 251 can be set as the control signal 142.

As a result of using the current sensing circuit 130 to monitor the current 132 being received at the power supply pin 112 (or being drawn by the electrical load 118), and comparing of the current 132 with the target current 133, an appropriate amount of adjustment can be made to the current 136 flowing into the electrical load 118 without modifying the regulated voltage 144, and without modifying the hardware and functions of the voltage generator 114. Further, by adjusting the current 136 flowing into the electrical load 118, while keeping the regulated voltage 144 fixed, the power consumption of the electrical load 118 can also be adjusted. To be described in more detail below, the circuit board 110 can perform a closed loop control scheme to monitor and adjust the current being drawn by the electrical load 118 of the functional unit 117, such that a host device (e.g., a processor 105 of the circuit board 102) need not have to perform power management for the circuit board 110.

Figure 3:
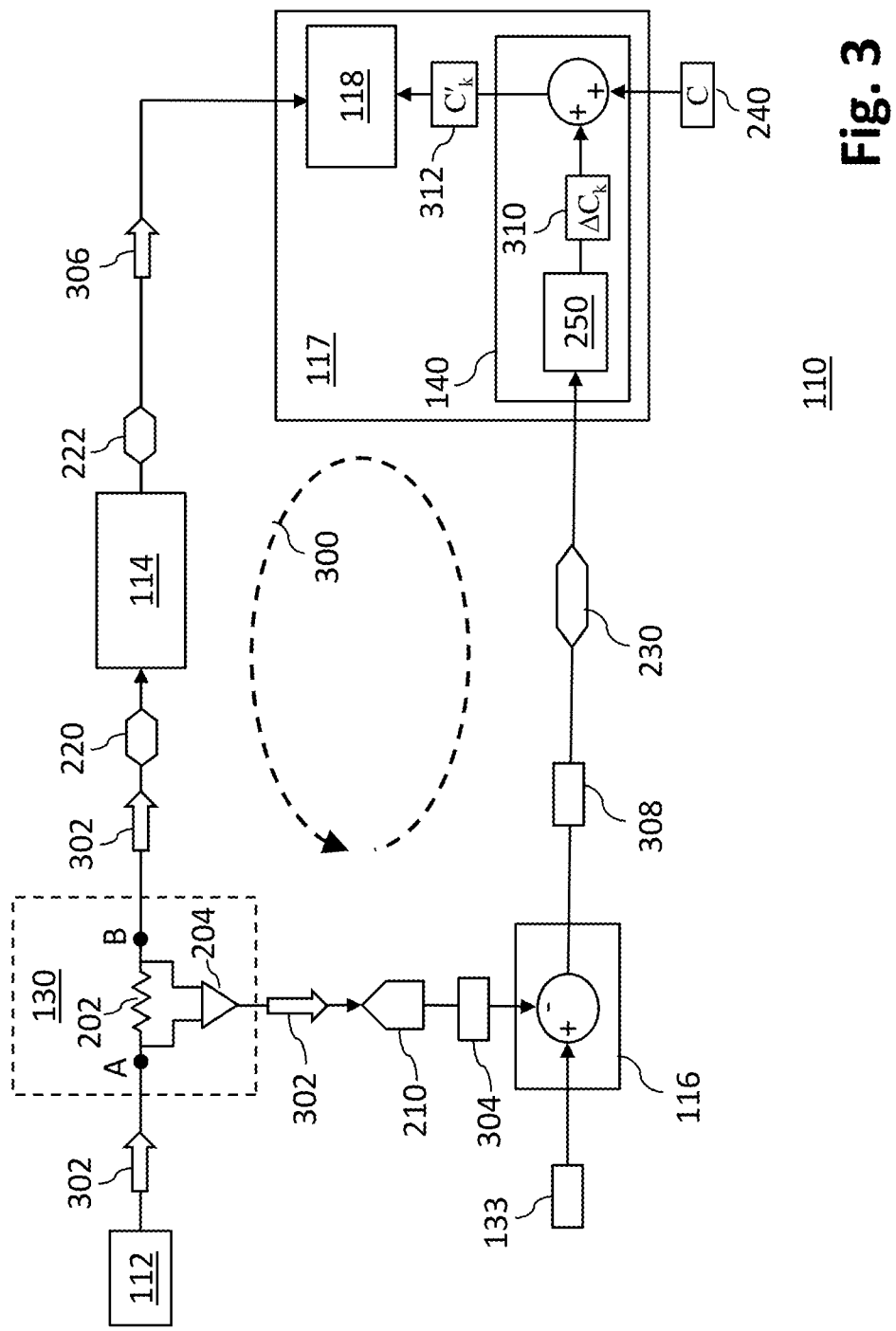
FIG. 3 is a diagram showing an example implementation of a continuous closed loop control that can be performed by the example system of FIG. 1.

FIG. 3 is a diagram showing an example implementation of a closed loop control that can be performed by the example system of FIG. 1. The circuit board 110, when integrated with the device 120 (shown in FIG. 1), can monitor current being drawn by the electrical load 118. For example, in response to applying the control signal 142 to the electrical load 118 in FIG. 1 and FIG. 2, the electrical load 118 can draw a new amount of current 302 from the circuit board 102. The current 302 can be, for example, based on an adjustment of the current 136 (shown in FIG. 1 and FIG. 2) using the parameter $\Delta C$, or using the parameter $C'$. The current sensing circuit 130 can detect the current 302 and send the current 302 to the ADC 210 and the voltage regulator 114. The ADC 210 can convert the current 302 into a current measurement 304, where the current measurement 304 can be a measured value of the current 302. The voltage regulator 114 can receive the current 302 and convert the current 302 into a current 306 based on a voltage conversion ratio being used by the voltage regulator 114. The current 306 can flow to the electrical load 118.

The power supply monitor 116 can compare the current measurement 304 with the target current 133 to determine, for example, whether the electrical load 118 is drawing too much or too little current. Based on the comparison, the power supply monitor 116 can determine a new current difference 308 between the target current 133 and the current 302 received from the current sensing circuit 130. The power supply monitor 116 can send the current difference 308 to the controller 140. The compensator 250 of the controller 140 can use the current difference 308 to calculate or determine a new load control parameter $\Delta C_k$, and generate a control signal 310 to represent the load control parameter $\Delta C_k$. The controller 140 can receive the signal 240 and combine $\Delta C_k$ with C to determine a parameter $C'_k$, and the controller 140 can generate another control signal 312 that represents $C'_k$. The controller 140 can adjust the operating frequency of the electrical load 118 by a factor of $C'_k$ (e.g., by applying the control signal 312 to electrical load 118) in order to adjust the current 306. By monitoring the current 302 being drawn by the electrical load 118, the circuit board 110 can update and re-adjust the current being consumed by the electrical load 118 (e.g., from current 136 to current 306). Thus, a closed loop 300 can be formed by the current sensing circuit 130, the power supply monitor 116, the controller 140, and the voltage regulator 114, where the closed loop 300 can be implemented repeatedly to monitor and adjust the current being drawn by the electrical load 118 without a host device (e.g., a main card or motherboard, such as the circuit board 102).

The closed loop 300 can be implemented repeatedly in a continuous or discrete manner, depending on a desired implementation of the system 100 shown in FIG. 1. In an example, the closed loop 300 can be implemented continuously by having the current sensing circuit 130 sensing each change to the current from the pin 112. For example, the current being drawn by the electrical load 118 at the pin 112 can change in response to the adjustment to the current flowing into the electrical load 118. The current sensing circuit 130 can detect the change to the current at the pin 112 and provide the measurement of the changed current to the power supply monitor 116 to initiate the closed loop 300. In another example, the closed loop 300 can be implemented in a discrete manner by having the current sensing circuit 130 sense the current from the pin 112 periodically at a defined time interval.

Figure 4:
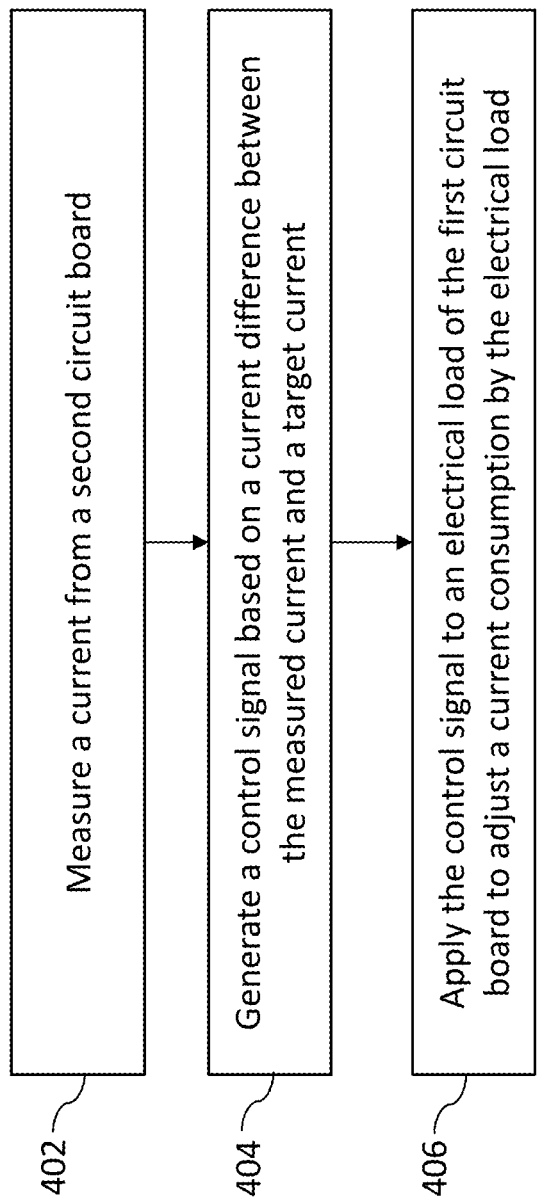
FIG. 4 is a flow diagram illustrating a process of implementing extension card current monitor in one embodiment.

FIG. 4 is a flow diagram illustrating a process 400 to implement extension card current monitor in one embodiment. The process 400 can include one or more operations, actions, or functions as illustrated by one or more of blocks 402, 404, and/or 406. Although illustrated as discrete blocks, various blocks can be divided into additional blocks, combined into fewer blocks, eliminated, or performed in parallel, depending on the desired implementation.

The process 400 can begin at block 402. At block 402, a device integrated in, or embedded on, a first circuit board can measure a current being drawn by the first circuit board from a second circuit board. The process 400 can proceed from block 402 to block 404. At block 404, the device can generate a control signal based on a current difference between the measured current and a target current. In some examples, the device can generate the control signal based on a combination of another control signal with a default load control signal. The process 400 can proceed from block 404 to block 406. At block 406, the device can apply the control signal to the electrical load of the first circuit board to adjust a current consumption by the electrical load.

In some examples, the device can further measure a new current being drawn by the electrical load, and generate a new control signal based on a new current difference between the new measured current and the target current. The device can apply the new current to the electrical load to re-adjust the current consumption by the electrical load of the first circuit board.

Figure 5:
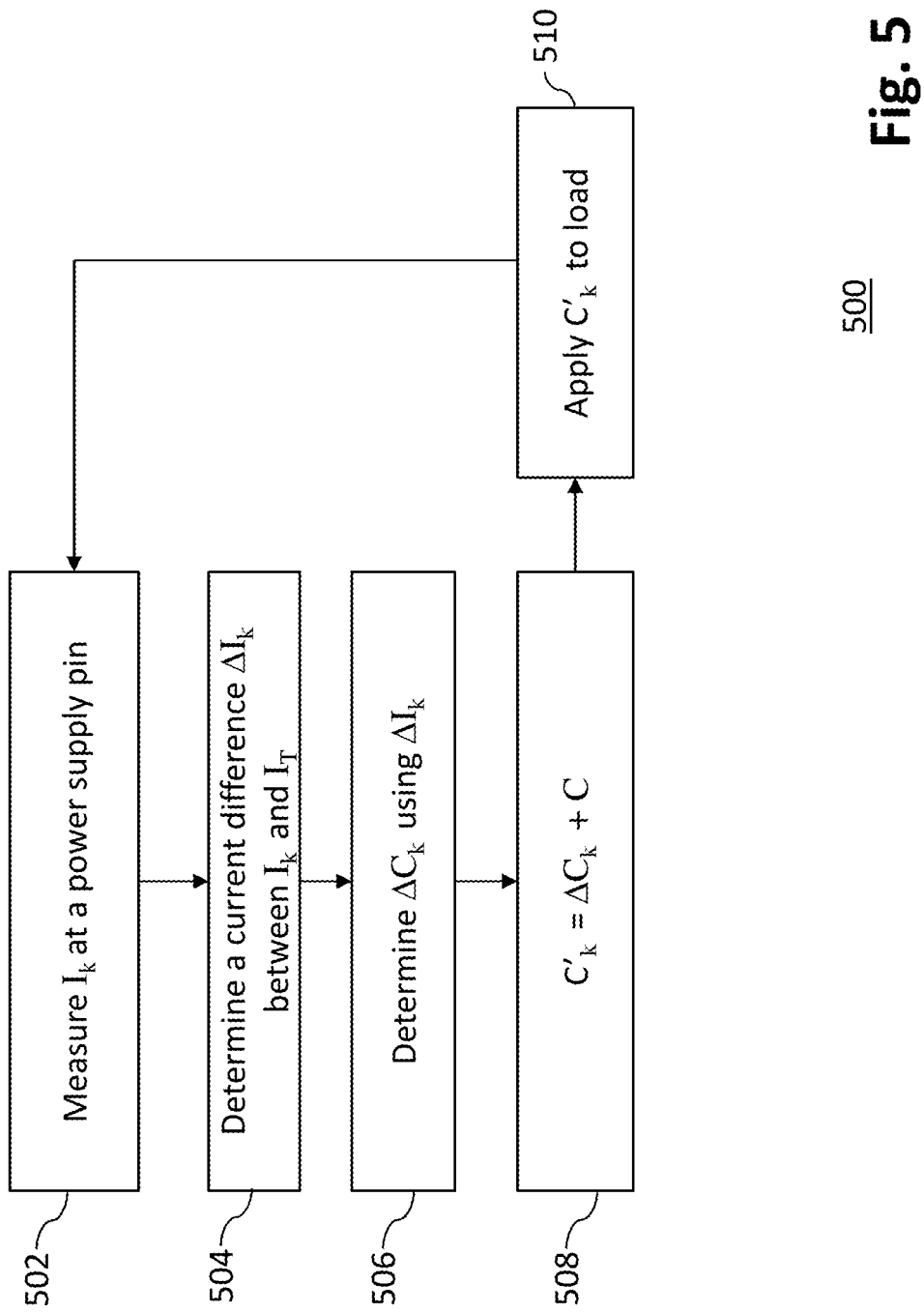
FIG. 5 is a flow diagram illustrating another process of implementing extension card current monitor in one embodiment.

FIG. 5 is a flow diagram illustrating another process 500 to implement extension card current monitor in one embodiment. The process 300 can include one or more operations, actions, or functions as illustrated by one or more of blocks 502, 504, 506, 508, and/or 510. Although illustrated as discrete blocks, various blocks can be divided into additional blocks, combined into fewer blocks, eliminated, or performed in parallel, depending on the desired implementation.

The process 500 can begin at block 502. At block 502, a first circuit board can measure a current $I_k$ being drawn by a load of the first circuit board from a second circuit board connected to the first circuit board. The process 500 can proceed from block 502 to block 504. At block 504, the first circuit board can determine a current difference $\Delta I_k$ between the measured current $I_k$ and a target current $I_T$. The process 500 can proceed from block 504 to block 506. At block 506, the first circuit board can determine or calculate a load control parameter $\Delta C_k$ using the current difference $\Delta I_k$. The process 500 can proceed from block 506 to block 508. At block 508, the first circuit board can combine the load control parameter $\Delta C_k$ with a default load control parameter C to generate another load control parameter $C'_k$. In some examples, the $\Delta C_k$ can be equivalent to $C'_k$ if C is zero (e.g., when the default load control parameter is not provided). The process 500 can proceed from block 508 to block 510. At block 510, the first circuit board can apply the parameter $C'_k$ to the load of the first circuit board to adjust an operating frequency of the load, where adjustment to the operating frequency of the load can adjust a current consumption by the load. The adjusted current consumption by the load can cause a new amount of current to be drawn by the load from the second circuit board.

The process 500 can return to block 502. The first circuit board can perform a loop of operations including blocks 502, 504, 506, 508, and 510, repeatedly to perform a closed loop control of power consumption by the load of the first circuit board. For example, a new iteration of the loop can measure a current $I_{k+1}$ at block 502, determine a current difference $\Delta I_{k+1}$ at block 504, determine a new value of the parameter $\Delta C_{k+1}$, and determine a new parameter $C'_{k+1}$, where $C'_{k+1}$ can be applied to the load to re-adjust the current consumption by the load.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device comprising:
   a current sensing circuit in a first circuit board configured to measure a current being drawn by an electrical load of the first circuit board from a second circuit board, wherein the current is measured from a power supply pin of the first circuit board that connects the first circuit board to the second circuit board;
   a controller in the first circuit board comprising hardware being configured to:
      receive a current difference between the measured current and a target current;
      in response to the current difference indicating the current being drawn is greater than the target current, determine a first load control parameter to decrease an operating frequency of the electrical load in the first circuit board;
      in response to the current difference indicating the current being drawn is less than the target current, determine a second load control parameter to increase the operating frequency of the electrical load in the first circuit board;
      generate a control signal based on one of the first and second load control parameters; and
      apply the control signal to the electrical load in the first circuit board to adjust the operating frequency, wherein the adjustment to the operating frequency adjusts a current consumption by the electrical load,
      wherein the control signal is a first control signal, and in response to the controller receiving a default control signal, the controller is further configured to combine the first control signal with the default control signal to generate a second control signal, the default control signal representing a default load control parameter received from another device external to the first circuit board,
      wherein the control signal applied to the electrical load in the first circuit board to adjust the operating frequency is the second control signal.

2. The device of claim 1, wherein:
   the current sensing circuit and the controller are connected to a power supply monitor of the first circuit board;
   the current sensing circuit is configured to send the measured current to the power supply monitor; and
   the controller is configured to receive the current difference from the power supply monitor.

3. The device of claim 1, wherein:
   the current sensing circuit comprises a current sensing resistor and a sense amplifier;
   a first terminal and a second terminal of the current sensing resistor are coupled to the sense amplifier; and
   the sense amplifier is configured to output the measured current to a power supply monitor of the first circuit board.

4. The device of claim 1, wherein the controller comprises a compensator configured to determine the load control parameter based on the current difference.

5. The device of claim 4, wherein the compensator is an analog compensator.

6. The device of claim 4, wherein the compensator is a digital compensator.

7. The device of claim 1, wherein the target current is a predefined value stored in a memory of the first circuit board.

8. The device of claim 1, wherein the controller is further configured to:
- receive a new current difference between the target current and a new current, the new current being an amount of current drawn by the electrical load in response to the adjustment of the current using the control signal;
- generate a new control signal based on the new current difference; and
- apply the new control signal to the electrical load to re-adjust the current consumption by the electrical load.

9. The device of claim 1, wherein the electrical load is a graphics processing unit (GPU).

10. An apparatus comprising:
- an electrical load of a device integrated in the apparatus;
- a voltage regulator connected to the electrical load;
- a power supply pin configured to receive a current from a circuit board external to the apparatus;
- a current sensing circuit of the device integrated in the apparatus, the current sensing circuit being connected to the power supply pin and the voltage regulator, the current sensing circuit being configured to measure the current from the power supply pin connecting the apparatus to the circuit board;
- a controller of the device integrated in the apparatus, the controller being connected to the electrical load and the voltage regulator, the controller being configured to:
- receive a current difference between the measured current and the target current;
- in response to the current difference indicating the current measured from the power supply pin is greater than the target current, determine a first load control parameter to decrease an operating frequency of the electrical load;
    - in response to the current difference indicating the current measured from the power supply pin is less than the target current, determine a second load control parameter to increase the operating frequency of the electrical load;
    - generate a control signal based on one of the first and second load control parameters; and
    - apply the control signal to the electrical load to adjust the operating frequency, wherein the adjustment to the operating frequency adjusts current being consumed by the electrical load from an output voltage of the voltage regulator,
- wherein the control signal is a first control signal, and in response to the controller receiving a default control signal, the controller is further configured to combine the first control signal with the default control signal to generate a second control signal, the default control signal representing a default load control parameter received from another device external to the device,
- wherein the control signal applied to the electrical load to adjust the operating frequency is the second control signal.

11. The apparatus of claim 10 wherein:
- the current sensing circuit is configured to send the measured current to a power supply monitor of the apparatus; and
- the controller is configured receive a current difference between the measured current and the target current from the power supply monitor.

12. The apparatus of claim 10, wherein:
- the current sensing circuit comprises a current sensing resistor and a sense amplifier;
- a first terminal and a second terminal of the current sensing resistor are coupled to the sense amplifier; and
- the sense amplifier is configured to output the measured current to a power supply monitor of the apparatus.

13. The apparatus of claim 10, wherein the controller comprises a compensator configured to determine the load control parameter based on the current difference.

14. The apparatus of claim 10, wherein the target current is a predefined value stored in a memory of the apparatus.

15. The apparatus of claim 10, wherein the electrical load is a graphics processing unit (GPU).

16. The apparatus of claim 10 further comprises a power supply monitor, wherein:
- the voltage regulator is configured to:
    - measure a new current being drawn by the electrical load; and
    - send the measurement of the new current to the power supply monitor;
- the power supply monitor is configured to:
    - compare the measurement of the new current with the target current;
    - determine a new current difference between the target current and the new current; and
    - send the new current difference to the controller;
- the controller is further configured to:
    - generate a new control signal based on the said another modulated current; and
    - apply the new control signal to the electrical load to re-adjust the current being consumed by the electrical load from the output voltage of the voltage regulator.

17. A method for controlling current consumption by an electrical load, the method comprising:
- measuring, by a device on a first circuit board, a current being drawn by an electrical load of the first circuit board from a second circuit board, wherein the current is measured from a power supply pin of the first circuit board that connects the first circuit board to the second circuit board;
- in response to a current difference between the measured current and a target current indicating the current being drawn is greater than the target current, determining, by the device on the first circuit board, a first load control parameter to decrease an operating frequency of the electrical load in the first circuit board;
- in response to the current difference indicating the current being drawn is less than the target current, determining, by the device on the first circuit board, a second load control parameter to increase the operating frequency of the electrical load in the first circuit board;
- generating, by the device on the first circuit board, a control signal based on one of the first and second load control parameters; and
- applying, by the device on the first circuit board, the control signal to the electrical load in the first circuit board to adjust the operating frequency, wherein the adjustment to the operating frequency adjusts a current consumption by the electrical load,
- wherein the control signal is a first control signal, and in response to the controller receiving a default control signal, the method further includes combining the first control signal with the default control signal to generate a second control signal, the default control signal representing a default load control parameter received from another device external to the first circuit board,
- wherein the applying, by the device on the first circuit board, the control signal to the electrical load in the first circuit board to adjust the operating frequency includes applying the second control signal to the electrical load in the first circuit board to adjust the operating frequency.

18. The method of claim 17, wherein generating the control signal comprises combining, by the device, one of the first and second load control parameters with a default load control parameter.

19. The method of claim 17, further comprising:
measuring, by the device, a new current being drawn by the electrical load;
generating, by the device, a new control signal based on a new current difference between the new measured current and the target current; and
applying, by the device, the new control signal to the electrical load of the first circuit board to re-adjust the current consumption by the electrical load.

20. The method of claim 17, wherein the electrical load is a graphics processing unit (GPU).

21. The device of claim 1, wherein the first circuit board is an expansion card, the second circuit board is a motherboard, and the device including the sensing circuit and controller is in the expansion card.

22. The device of claim 1, wherein the current consumption by the electrical load consumes current of an output voltage being outputted by a voltage regulator in the first circuit board, and the adjustment to the current consumption is performed while keeping the output voltage fixed.

23. The apparatus of claim 10, wherein the adjustment to the current consumption is performed while keeping the output voltage fixed.

* * * * *